(12) United States Patent
Tsuji

(10) Patent No.: US 9,941,666 B2
(45) Date of Patent: Apr. 10, 2018

(54) METHOD FOR PRODUCING QUANTUM CASCADE LASER AND QUANTUM CASCADE LASER

(71) Applicant: SUMITOMO ELECTRIC INDUSTRIES, LTD., Osaka (JP)

(72) Inventor: Yukihiro Tsuji, Tama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/372,334

(22) Filed: Dec. 7, 2016

(65) Prior Publication Data

US 2017/0170633 A1 Jun. 15, 2017

(30) Foreign Application Priority Data

Dec. 9, 2015 (JP) ................................. 2015-240460

(51) Int. Cl.
*H01S 5/227* (2006.01)
*H01S 5/12* (2006.01)
*H01S 5/34* (2006.01)
*H01S 5/22* (2006.01)

(52) U.S. Cl.
CPC ............ *H01S 5/2275* (2013.01); *H01S 5/124* (2013.01); *H01S 5/1215* (2013.01); *H01S 5/3401* (2013.01); *H01S 5/1225* (2013.01); *H01S 5/1228* (2013.01); *H01S 5/2224* (2013.01)

(58) Field of Classification Search
CPC ............................ H01S 5/2275; H01S 5/1215
See application file for complete search history.

(56) References Cited

U.S. PATENT DOCUMENTS

2015/0357794 A1* 12/2015 Tsuji .................... H01S 5/3402
372/45.012

FOREIGN PATENT DOCUMENTS

JP 2001-320136 11/2001

* cited by examiner

*Primary Examiner* — Dung Nguyen
(74) *Attorney, Agent, or Firm* — Smith, Gambrell & Russell, LLP.

(57) ABSTRACT

A method for producing a quantum cascade laser includes the steps of forming a laser structure including a mesa structure and a buried region embedding the mesa structure; forming a mask on the laser structure, the mask including a first pattern that defines a $\lambda/4$ period distribution Bragg reflector structure and a second pattern that defines a $3\lambda/4$ period distribution Bragg reflector structure; and forming a first distribution Bragg reflector structure, a second distribution Bragg reflector structure, and a semiconductor waveguide structure by dry-etching the laser structure through the mask, the semiconductor waveguide structure including the mesa structure that has first and second end facets. The first distribution Bragg reflector structure is optically coupled to the first end facet. The second distribution Bragg reflector structure is optically coupled to the second end facet. Here, $\lambda$ denotes a value of an oscillation wavelength of the quantum cascade laser in vacuum.

4 Claims, 14 Drawing Sheets

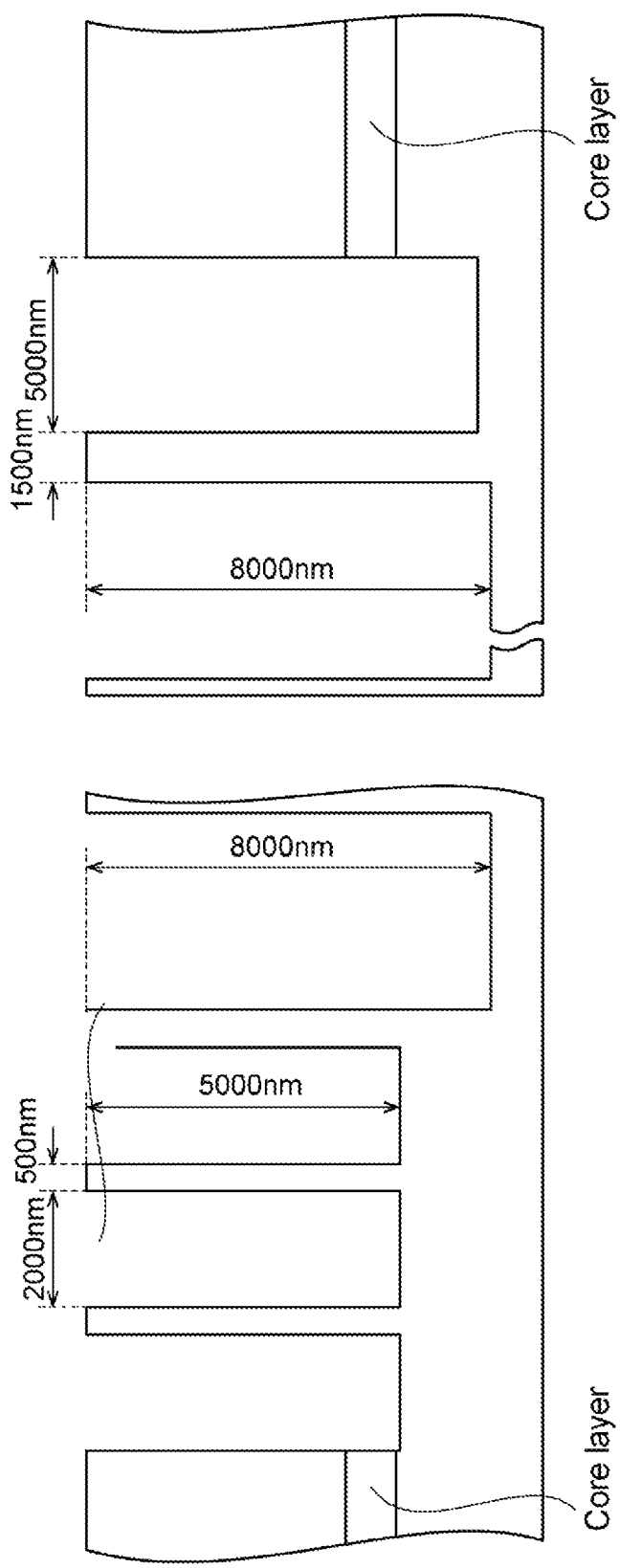

METHOD FOR PRODUCING QUANTUM CASCADE LASER AND QUANTUM CASCADE LASER

BACKGROUND OF THE INVENTION

1. Field of the Invention

The present invention relates to a method for producing a quantum cascade laser and to a quantum cascade laser.

2. Description of the Related Art

Japanese Patent Application No. 2001-136193 discloses a quantum cascade laser.

SUMMARY OF THE INVENTION

A quantum cascade laser emits light in a mid-infrared wavelength band, for example, a 3 to 10 µm wavelength band, by using inter-subband transition. Quantum cascade lasers incorporated in portable devices, for example, gas detectors, are required to operate at low power consumption. Decreasing the cavity length of a quantum cascade laser is effective for decreasing the threshold current and enables low power consumption. Specifically, the threshold current may be effectively decreased by setting the cavity length to, for example, 50 µm to 500 µm. Providing a high-reflection (HR) coating on an end facet of a semiconductor laser is also effective for decreasing the threshold current and the power consumption. The reflectivity of the high-reflection coating is set to be, for example, 90% or higher.

A reflection coating on an end facet of a semiconductor laser is usually formed on an end facet of a bar-shape semiconductor product, for example, a semiconductor laser bar. A semiconductor laser bar that includes an array of semiconductor lasers of short cavity lengths is very small and needs to be handled carefully. Moreover, in order to obtain a high reflectivity, both end facets of this semiconductor laser bar may be coated with thick end facet coatings.

Instead of forming high-reflection coating films on end facets of a semiconductor laser, a distribution Bragg reflector (DBR) may be used as a reflection mirror of a laser cavity. When a distribution Bragg reflector constitutes a laser cavity, the issue of handling of the laser bar in forming high-reflection end facet coatings on both end facets of a short-cavity-length laser bar may be avoided.

A quantum cascade laser includes two reflectors that constitute a laser cavity. One of the reflectors has a high reflectivity and the other one of the reflectors has a lower reflectivity than the other reflector. What is required is to enhance flexibility of setting the reflectivity of each of plural reflectors constituting the laser cavity.

A method for producing a quantum cascade laser according to an aspect of the present invention includes the steps of (a) forming a laser structure on a principal surface of a substrate, the laser structure including a mesa structure and a buried region embedding the mesa structure, the mesa structure including a quantum cascade core layer; (b) forming a mask on the laser structure, the mask including a first pattern that defines a $\lambda/4$ period distribution Bragg reflector structure and a second pattern that defines a $3\lambda/4$ period distribution Bragg reflector structure; and (c) forming a first distribution Bragg reflector structure having a $\lambda/4$ periodic structure, a second distribution Bragg reflector structure having a $3\lambda/4$ periodic structure, and a semiconductor waveguide structure by dry-etching the laser structure through the mask, the semiconductor waveguide structure including the mesa structure that has a first end facet and a second end facet. The first distribution Bragg reflector structure is optically coupled to the first end facet of the semiconductor waveguide structure. The second distribution Bragg reflector structure is optically coupled to the second end facet of the semiconductor waveguide structure. Here, $\lambda$ denotes a value of an oscillation wavelength of the quantum cascade laser in vacuum.

A quantum cascade laser according to another aspect of the present invention includes a mesa structure having a first end facet and a second end facet, the mesa structure including a quantum cascade core layer; a first distribution Bragg reflector structure that is optically coupled to the first end facet of the mesa structure, the first distribution Bragg reflector structure having a $\lambda/4$ periodic structure; and a second distribution Bragg reflector structure that is optically coupled to the second end facet of the mesa structure, the second distribution Bragg reflector structure having a $3\lambda/4$ periodic structure. The first distribution Bragg reflector structure includes a first semiconductor wall placed a first interval apart from the first end facet of the mesa structure. The second distribution Bragg reflector structure includes a second semiconductor wall placed a second interval apart from the second end facet of the mesa structure. The second semiconductor wall has a height different from that of the first semiconductor wall. In addition, the first semiconductor wall and the second semiconductor wall each have a width larger than a width of the mesa structure. Here, $\lambda$ denotes a value of an oscillation wavelength of the quantum cascade laser in vacuum.

The above-described object of the present invention and other objects, features, and advantageous effects will be more readily apparent from the detailed description of preferable embodiments of the present invention with reference to the attached drawings.

BRIEF DESCRIPTION OF THE DRAWINGS

FIGS. 6A and 6B are cross-sectional views of two distribution Bragg reflector structures formed in the same element block.

DESCRIPTION OF THE PREFERRED EMBODIMENTS

Figure 1A:
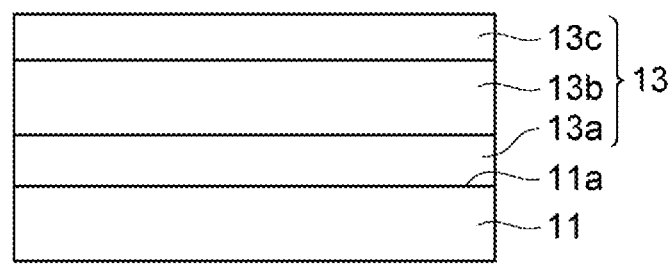
FIGS. 1A to 1C are schematic diagrams illustrating major steps of a method for producing a quantum cascade laser according to an embodiment.

Some specific examples will now be described.

A method for producing a quantum cascade laser according to an embodiment of the present invention includes the steps of (a) forming a laser structure on a principal surface of a substrate, the laser structure including a mesa structure and a buried region embedding the mesa structure, the mesa structure including a quantum cascade core layer; (b) forming a mask on the laser structure, the mask including a first pattern that defines a λ/4 period distribution Bragg reflector structure and a second pattern that defines a 3λ/4 period distribution Bragg reflector structure; and (c) forming a first distribution Bragg reflector structure having a λ/4 periodic structure, a second distribution Bragg reflector structure having a 3λ/4 periodic structure, and a semiconductor waveguide structure by dry-etching the laser structure through the mask, the semiconductor waveguide structure including the mesa structure that has a first end facet and a second end facet. The first distribution Bragg reflector structure is optically coupled to the first end facet of the semiconductor waveguide structure. The second distribution Bragg reflector structure is optically coupled to the second end facet of the semiconductor waveguide structure. Here, λ denotes a value of an oscillation wavelength of the quantum cascade laser in vacuum.

According to the method for producing a quantum cascade laser, both the second distribution Bragg reflector structure having a 3λ/4 periodic structure and the first distribution Bragg reflector structure having a λ/4 periodic structure are formed by the process of dry-etching the laser structure. Etching proceeds faster in the area where the second distribution Bragg reflector structure having a 3λ/4 periodic structure is to be formed than in the area where the first distribution Bragg reflector structure having a λ/4 periodic structure is to be formed. As a result, the etch depth of the 3λ/4 periodic structure is larger than the etch depth of the λ/4 periodic structure. Because of this periodic structure having a large depth, the second distribution Bragg reflector structure has a relatively large reflectivity. Likewise, because of this periodic structure having a small depth, the first distribution Bragg reflector structure has a relatively small reflectivity. This difference in structure makes it possible to generate a difference in reflectivity between the two distribution Bragg reflector structures from a technical viewpoint different from the difference in reflectivity generated by the 3λ/4 period and the λ/4 period.

In the method for producing a quantum cascade laser according to an embodiment, the substrate preferably includes a first region, a second region, and a third region disposed between the first region and the second region. The first distribution Bragg reflector structure includes a first semiconductor wall disposed in the first region to constitute a distribution Bragg reflector structure, the first semiconductor wall being placed a first interval apart from the first end facet of the semiconductor waveguide structure. The second distribution Bragg reflector structure includes a second semiconductor wall disposed in the second region to constitute a distribution Bragg reflector structure, the second semiconductor wall being placed a second interval apart from the second end facet of the semiconductor waveguide structure. In addition, the semiconductor waveguide structure is disposed in the third region.

According to the method for producing a quantum cascade laser, the first semiconductor wall of the first distribution Bragg reflector structure is placed a first interval apart from the first end facet of the semiconductor waveguide structure. The second semiconductor wall of the second distribution Bragg reflector structure is placed a second interval apart from the second end facet of the semiconductor waveguide structure. The first interval and the second interval, both of which are simultaneously produced in the dry etching step for processing the laser structure, are different from each other. A mask used in this dry etching step includes a first pattern for the first distribution Bragg reflector structure and a second pattern for the second distribution Bragg reflector structure. The first pattern includes a first opening that corresponds to the first interval between the first semiconductor wall and the first end facet of the semiconductor waveguide structure. The second pattern includes a second opening that corresponds to the second interval between the second semiconductor wall and the second end facet of the semiconductor waveguide structure. Because of the difference in width between the first opening and the second opening, the difference in local etching rate between individual areas is generated. Specifically, the etch depth obtained by a wide opening is larger than the etch depth obtained by a narrow opening. This difference (difference in width) generates the difference in height between the first semiconductor wall and the second semiconductor wall.

In the method for producing a quantum cascade laser according to an embodiment, preferably, the mesa structure extends in a direction of a first axis. The first semiconductor wall protrudes in a direction of a second axis that intersects the principal surface of the substrate. The first distribution Bragg reflector structure includes a first side wall that connects a first end of the first semiconductor wall to the semiconductor waveguide structure and a second side wall that connects a second end of the first semiconductor wall to the semiconductor waveguide structure. In addition, the first end and the second end of the first semiconductor wall are arranged in a direction of a third axis that intersects the first axis and the second axis.

According to the method for producing a quantum cascade laser, the first and second ends of the first semiconductor wall are respectively connected to the first and second side walls. Thus, etching gas is supplied through the first opening that corresponds to the first interval between the first end facet of the semiconductor waveguide structure and the first semiconductor wall. The area of the first opening changes depending on the interval between the first side wall and the second side wall.

In the method for producing a quantum cascade laser according to an embodiment, preferably, the step of dry-etching the laser structure is performed by using an etchant containing halogen-based gas.

According to the method for producing a quantum cascade laser, the etchant containing halogen gas enables etching of a III-V group compound semiconductor.

A quantum cascade laser according to an embodiment includes (a) a mesa structure having a first end facet and a second end facet, the mesa structure including a quantum cascade core layer; (b) a first distribution Bragg reflector structure that is optically coupled to the first end facet of the mesa structure, the first distribution Bragg reflector structure having a λ/4 periodic structure; and (c) a second distribution Bragg reflector structure that is optically coupled to the second end facet of the mesa structure, the second distribution Bragg reflector structure having a $3\lambda/4$ periodic structure. The first distribution Bragg reflector structure includes a first semiconductor wall placed a first interval apart from the first end facet of the mesa structure. The second distribution Bragg reflector structure includes a second semiconductor wall placed a second interval apart from the second end facet of the mesa structure. The second semiconductor wall has a height different from that of the first semiconductor wall. In addition, the first semiconductor wall and the second semiconductor wall each have a width larger than a width of the mesa structure. Here, $\lambda$ denotes a value of an oscillation wavelength of the quantum cascade laser in vacuum.

In the quantum cascade laser, the first interval between one side surface of the first semiconductor wall of the first distribution Bragg reflector structure and the first end facet of the mesa structure is correlated to a $\lambda/4$ periodic structure. The second interval between one side surface of the second semiconductor wall of the second distribution Bragg reflector structure and the second end facet of the mesa structure is correlated to the $3\lambda/4$ periodic structure. The first distribution Bragg reflector structure and the second distribution Bragg reflector structure respectively have the first semiconductor wall and the second semiconductor wall each having a width larger than a width of the mesa structure. This structure is suitable for reflecting light in the infrared wavelength range. Since the height of the first semiconductor wall is different from the height of the second semiconductor wall, the reflectivity of each of these distribution Bragg reflector structures is adjustable by controlling the height of the semiconductor walls. Specifically, the distance between the lower surface of the quantum cascade core layer and the lower end of the first semiconductor wall is different from the distance between the lower surface of the quantum cascade core layer and the lower end of the second semiconductor wall. This difference in distance generates a difference in reflecting light propagating in the semiconductor portion below the lower surface of the quantum cascade core layer.

DETAILED DESCRIPTION OF EMBODIMENTS

The findings of the present invention can be easily understood from the following detailed description making reference to the attached drawings illustrating examples.

Embodiments of the method for producing a quantum cascade laser and embodiments of the quantum cascade laser will now be described with reference to the attached drawings. If possible, the same parts are represented by the same reference symbols.

FIGS. 1A to 1C, 2A, 2B, 3A, 3B, 4, 5, and 7A to 7C are schematic views of major steps of the method for producing a quantum cascade laser according to one embodiment. In the production process, a laser structure is formed and processed to form first and second distribution Bragg reflector (DBR) structures. In this embodiment, the laser structure is first formed. The method for forming the laser structure will now be described.

A substrate used for crystal growth of semiconductor layers (for example, a substrate 11 shown in FIG. 1A) is formed. This substrate may include, for example, a semiconductor wafer. Specifically, the substrate includes a III-V compound semiconductor such as InP. As illustrated in FIG. 1A, a stacked semiconductor layer 13 is grown on a principal surface 11a of the substrate 11. For example, a metal-organic vapor phase epitaxy method and/or a molecular beam epitaxial growth method may be employed for this growth. The stacked semiconductor layer 13 includes, for example, a semiconductor layer 13a for forming a quantum cascade core layer and a semiconductor layer 13b for forming an upper cladding layer. If needed, the stacked semiconductor layer 13 may include a semiconductor layer 13c for forming a contact layer or a cap layer. Furthermore, if needed, the stacked semiconductor layer 13 may include a semiconductor layer for forming a lower cladding layer or a buffer layer.

Example of Substrate 11: n-Type InP Wafer
Example of the Stacked Semiconductor Layer 13:

Semiconductor layer 13a for forming a quantum cascade core layer: InGaAs/AlInAs multi quantum well (MQW) structure, 3 μm in thickness Semiconductor layer 13b for forming an upper cladding layer: n-type InP, 3 μm in thickness Semiconductor layer 13c for forming a contact layer: n-type GaInAs, 100 nm in thickness Semiconductor layer for forming a lower cladding layer or a buffer layer: n-type InP The MQW structure includes InGaAs/AlInAs stacked layer arranged to enable the quantum cascade laser to oscillate in a wavelength range of 3 to 10 μm. The upper cladding layer has the same conductivity type as the semiconductor constituting the substrate 11. The lower cladding layer or the buffer layer has the same conductivity type as the semiconductor constituting the substrate 11.

Figure 1B:
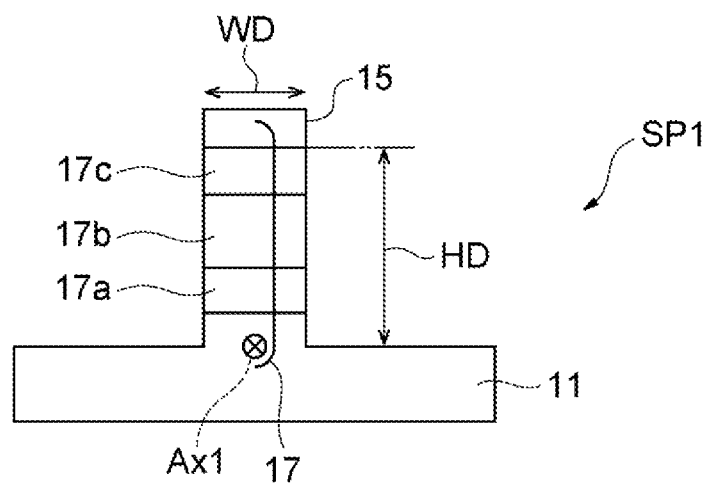

An insulator mask (insulator mask 15 shown in FIG. 1B) is formed on the stacked semiconductor layer 13. The insulator mask 15 has a pattern that defines the shape of a waveguide mesa that includes a core layer (active layer). In this embodiment, the pattern of the insulator mask 15 has a stripe shape that traverses from one side to the opposite side of one of a plurality of device sections on a wafer. The pattern of the insulator mask 15 extends in a first axis Ax1 direction. The insulator mask 15 contains, for example, a silicon-based inorganic insulator film. The silicon-based inorganic insulator contains, for example, silicon nitride (SiN), silicon dioxide ($SiO_2$), or silicon oxide nitride (SiON). The SiN film is formed by, for example, a chemical vapor deposition (CVD) method. The thickness of the insulator mask 15 is about 100 to 1000 nm. As illustrated in FIG. 1B, the stacked semiconductor layer 13 is etched through the insulator mask 15. As a result of etching, the stacked semiconductor layer 13 and the surface portion of the substrate 11 are processed to form a mesa structure 17. The mesa structure 17 has a mesa shape and extends in the direction of the first axis Ax1. The mesa structure 17 is disposed on the principal surface 11a of the substrate 11. FIG. 1B is a cross-sectional view taken in a direction intersecting the first axis Ax1. The mesa height HD of the mesa structure 17 is about 5 to 10 μm. In the embodiment, the mesa height HD is, for example, 7 μm. The mesa width W0 of the mesa structure 17 is about 3 to 10 μm. In the embodiment, the mesa width W0 is, for example, 10 μm. The mesa structure 17 includes a core layer 17a that includes a quantum cascade structure, an upper cladding layer 17b, and a contact layer 17c. Etching is performed by dry-etching using a halogen-based etchant. Examples of the halogen-based etchant include chlorine, hydrogen chloride, silicon tetrachloride, boron trichloride, hydrogen bromide, and hydrogen iodide. The insulator mask 15 remains unremoved. In the etching step, a first substrate product SP1 that includes the mesa structure 17 is formed. A substrate surface of the first substrate product SP1 and side surfaces of the mesa structure 17 are exposed. The upper surface of the mesa structure 17 is covered with the insulator mask 15.

Figure 1C:
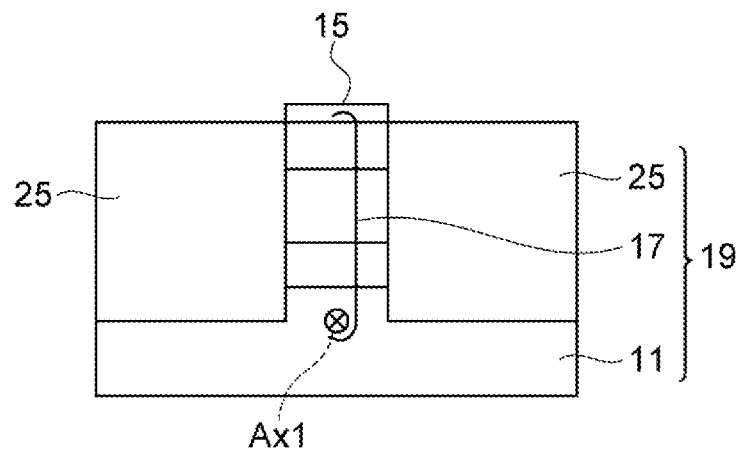

As illustrated in FIG. 1C, after etching, a semiconductor layer is grown on the side surfaces of the mesa structure 17 on the first substrate product SP1 so as to form a buried region 25 that embeds the mesa structure 17. In this embodiment, a desired semiconductor growth is performed on the first substrate product SP1 to bury the mesa structure 17. During this crystal growth, a semiconductor layer is selectively grown on the substrate surface of the first substrate product SP1 and the side surfaces of the mesa structure 17. Meanwhile, the semiconductor layer is not grown on the upper surface of the mesa structure 17 covered with the insulator mask 15. The buried region 25 is composed of a semi-insulating III-V compound semiconductor, for example, iron-doped InP.

After forming the buried region 25, the insulator mask 15 is removed from the first substrate product SP1 to obtain a second substrate product SP2. The insulator mask 15 made of SiN is etched away with, for example, buffered hydrofluoric acid. After removing the insulator mask 15, an upper surface 17d of the mesa structure 17 is exposed at the surface of the second substrate product SP2.

A laser structure 19 is formed through these steps. The laser structure 19 includes a substrate 11, a mesa structure 17 on the principal surface 11a of the substrate 11, and a buried region 25 that embeds the mesa structure 17 on the principal surface 11a of the substrate 11. FIG. 1C illustrates one of the device sections of the substrate 11. The wafer on which the buried region 25 is to be grown includes not only one mesa structure 17 shown in FIG. 1C but also an array of one or more mesa structures that are substantially identical to the mesa structure 17. The buried region 25 is formed between the mesa structures in this array.

Figure 2A:
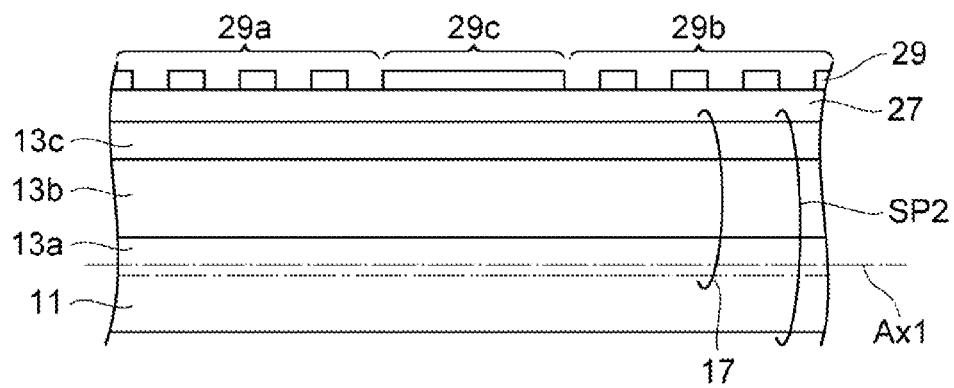
FIGS. 2A and 2B are schematic diagrams illustrating major steps of the method for producing a quantum cascade laser according to the embodiment.

After removal of the insulator mask 15, a patterned mask is formed on the mesa structure 17 and the buried region 25. The specific procedure therefor is as follows. FIG. 2A is a cross-sectional view of the mesa structure 17 taken along the first axis Ax1. The mesa structure 17 extends in the direction of the first axis Ax1. An insulating film 27 used as a mask for forming a reflector is formed on the second substrate product SP2. This insulating film 27 is composed of, for example, a silicon-based inorganic insulator. Examples of the silicon-based inorganic insulator include silicon nitride, silicon dioxide, and silicon oxide nitride. Silicon nitride, silicon dioxide, and silicon oxide nitride respectively include, for example, SiN, $SiO_2$, and SiON. These silicon-based inorganic insulators are formed by, for example, a chemical vapor deposition (CVD) method. The thickness of the insulating film 27 is about 100 to 1000 nm. In this embodiment, the thickness of the insulating film 27 is 500 nm.

Referring to FIG. 2A, a resist is applied and exposed to form a pattern of a mask for forming a reflector. Specifically, a resist is applied onto the insulating film 27 and then exposure EXPS for transferring the pattern of a mask for forming a reflector onto the resist is performed so as to form a resist mask 29. The width of the reflector to be formed is larger than the width of the mesa structure 17; hence, the mask pattern is formed on the mesa structure 17 and the buried region 25. During the exposure EXPS, the pattern of the reflector mask is transferred onto the resist. As a result, a resist mask 29 is formed. The pattern of the resist mask 29 is wider than the mesa structure 17. In FIG. 2A, the mesa structure 17 extends in the direction of the first axis Ax1. The resist mask 29 includes a first pattern portion 29a, a second pattern portion 29b, and a waveguide pattern portion 29c in each of the device sections. The first pattern portion 29a defines the distribution Bragg reflector structure having one of the $\lambda/4$ period and the $3\lambda/4$ period. The second pattern portion 29b defines the distribution Bragg reflector structure having the other one of the $\lambda/4$ period and the $3\lambda/4$ period. The opening size of the pattern portion (one of 29a and 29b) having the $\lambda/4$ period is smaller than the opening size of the pattern portion (the other one of 29a and 29b) having the $3\lambda/4$ period. Here, $\lambda$ represents the emission wavelength of the quantum cascade laser (wavelength in vacuum).

Figure 2B:
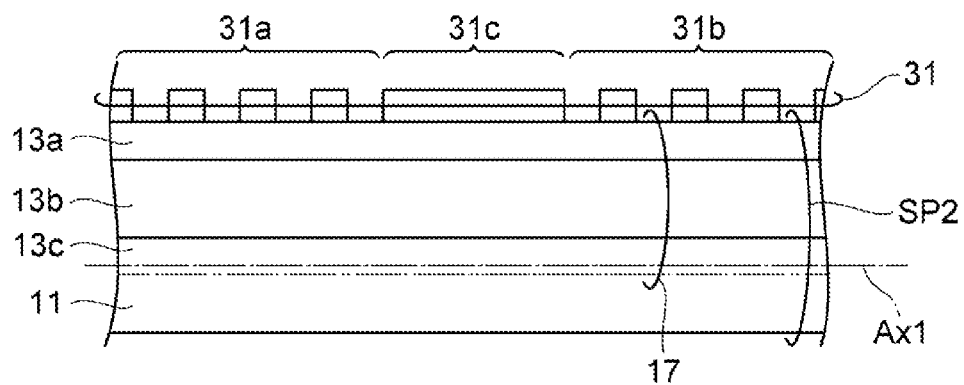

The insulating film 27 is dry-etched through this resist mask 29 so as to form a mask 31 for defining the shape of the reflector, as illustrated in FIG. 2B. The mask 31 includes a first mask portion 31a (the pattern that defines the distribution Bragg reflector structure having one of the $\lambda/4$ period and the $3\lambda/4$ period) corresponding to the first pattern portion 29a, a second mask portion 31b (the pattern that defines the distribution Bragg reflector structure having the other one of the $\lambda/4$ period and the $3\lambda/4$ period) corresponding to the second pattern portion 29b, and a third mask portion 31c (the pattern that defines the waveguide length) corresponding to the waveguide pattern portion 29c in each of the device sections.

Figure 3A:
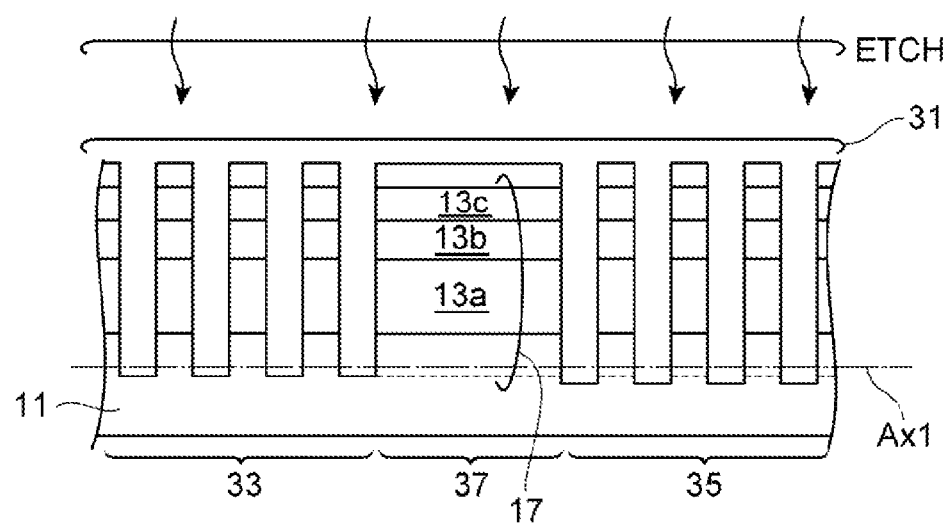
FIGS. 3A and 3B are schematic diagrams illustrating major steps of the method for producing a quantum cascade laser according to the embodiment.

In forming the reflector, as illustrated in FIG. 3A, the semiconductor region below the mask 31, namely, the buried region 25 and the mesa structure 17 in this embodiment, is dry-etched (ETCH) through the mask 31 so as to form a third substrate product SP3. Dry-etching ETCH is performed by using, for example, halogen-based gas as an etchant in an inductive coupled plasma reactive ion etching (ICP-RIE) apparatus. The third substrate product SP3 includes a first distribution Bragg reflector structure 33, a second distribution Bragg reflector structure 35, and a semiconductor waveguide structure 37 that constitute the quantum cascade laser. In the semiconductor waveguide structure 37, a mesa structure 39 has a length in the range of 3 to 10 μm, for example, and is embedded by the buried region 25 that remains unetched. The mask 31 has openings derived from the reflector pattern of the resist mask 29.

Example of Dry Etching ETCH:

Halogen-based gas etchant: chlorine, hydrogen chloride, silicon tetrachloride, boron trichloride, hydrogen bromide, or hydrogen iodide Etching method of etching apparatus: inductive coupled plasma reactive ion etching (ICP-RIE), capacitative coupled plasma reactive ion etching (CCP-RIE), or electron cyclotron resonance plasma reactive ion etching (ECR-RIE).

The first distribution Bragg reflector structure 33 includes first semiconductor walls 34a, 34b, and 34c formed by etching. The second distribution Bragg reflector structure 35 includes second semiconductor walls 36a, 36b, and 36c formed by etching. Each of the first semiconductor walls 34a, 34b, and 34c has a width larger than the mesa width W0 of the mesa structure 39. The first semiconductor walls 34a, 34b, and 34c are defined by first openings 34d, 34e, 34f, and 34g. The first semiconductor walls 34a, 34b, and 34c and the first openings 34d, 34e, 34f, and 34g are alternately arranged to form a periodic change in refractive index. Each of the second semiconductor walls 36a, 36b, and 36c has a width larger than the mesa width W0 of the mesa structure 39. The second semiconductor walls 36a, 36b, and 36c are defined by second openings 36d, 36e, 36f, and 36g.

The period of the first distribution Bragg reflector structure 33 is different from the period of the second distribution Bragg reflector structure 35. The height (H1) of the first semiconductor walls 34a, 34b, and 34c of the first distribution Bragg reflector structure 33 is different from the height (H2) of the second semiconductor walls 36a, 36b, and 36c of the second distribution Bragg reflector structure 35. The depth (D1) of the first openings 34d, 34e, and 34f of the first distribution Bragg reflector structure 33 is different from the depth (D2) of the second openings 36d, 36e, and 36f of the second distribution Bragg reflector structure 35.

List of Combinations of Period and Depth (Height)

Structure A: a combination of a shallow distribution Bragg reflector structure having a λ/4 period and a deep distribution Bragg reflector structure having a 3λ/4 period Structure B: a combination of a deep distribution Bragg reflector structure having a λ/4 period and a shallow distribution Bragg reflector structure having a 3λ/4 period The period of a distribution Bragg reflector structure is correlated to the reflectivity of the distribution Bragg reflector structure. Assuming that a distribution Bragg reflector structure having a λ/4 period and a distribution Bragg reflector structure having a 3λ/4 are identical except for their period, the reflectivity of the distribution Bragg reflector structure having a λ/4 period is larger than the reflectivity of the distribution Bragg Reflector Structure Having a 3λ/4 Period.

In this embodiment, the structure A (a combination of a shallow distribution Bragg reflector structure having a λ/4 period and a deep distribution Bragg reflector structure having a 3λ/4 period) is formed. This structure is advantageous in that it is formed by conducting dry etching once through a single mask 31. A quantum cascade laser generates a long-wavelength laser beam in an infrared region, for example, the mid-infrared wavelength region. A long-wavelength beam not only propagates in the mesa structure 39 but also spreads to the substrate 11 as it propagates. Therefore, the depth of the distribution Bragg reflector structure is correlated to the reflection of optical components propagating in the substrate 11.

Figure 4:
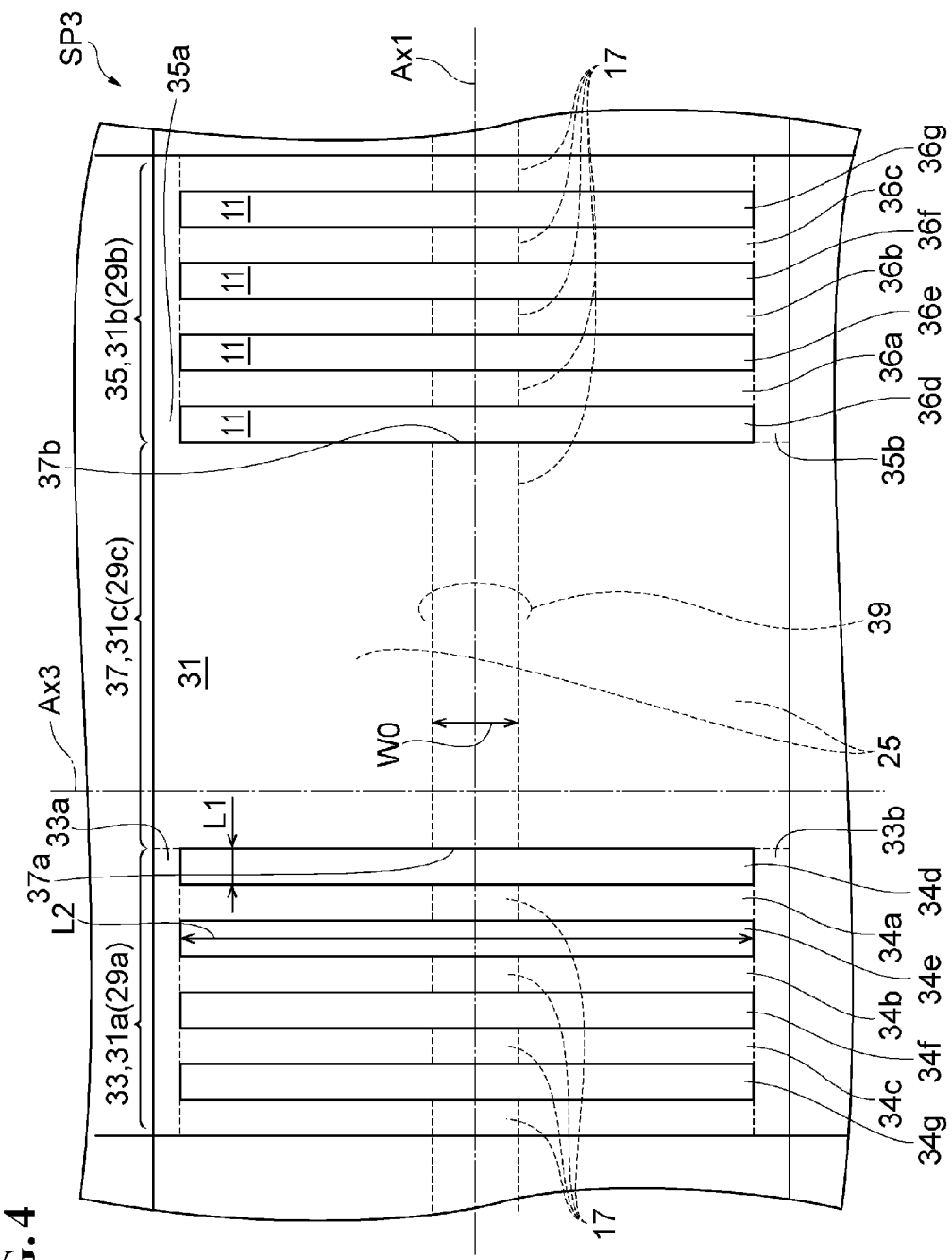
FIG. 4 is a schematic diagram illustrating major steps of the method for producing a quantum cascade laser according to the embodiment.

FIG. 4 is a plan view of a laser structure after etching. Referring to FIGS. 3A and 4, the mask 31 is left unetched. In each of the device sections, the first mask portion 31a, the second mask portion 31b, and the third mask portion 31c of the mask 31 respectively correspond to the first pattern portion 29a, the second pattern portion 29b, and the waveguide pattern portion 29c of the resist mask 29. In this embodiment, the first distribution Bragg reflector structure 33 has a λ/4 period and the second distribution Bragg reflector structure 35 has a 3λ/4 period. The height of the second semiconductor walls 36a, 36b, and 36c of the second distribution Bragg reflector structure 35 is larger than the height of the first semiconductor walls 34a, 34b, and 34c of the first distribution Bragg reflector structure 33. The depth of the second openings 36d, 36e, and 36f of the second distribution Bragg reflector structure 35 is larger than the depth of the first openings 34d, 34e, and 34f of the first distribution Bragg reflector structure 33.

In the third substrate product SP3, the first distribution Bragg reflector structure 33, the second distribution Bragg reflector structure 35, and the mesa structure 39 are aligned in a direction of the first axis Ax1. The semiconductor waveguide structure 37 includes a first end facet 37a and a second end facet 37b. The first end facet 37a and the second end facet 37b of the mesa structure 39 in the semiconductor waveguide structure 37 are respectively optically coupled to the first distribution Bragg reflector structure 33 and the second distribution Bragg reflector structure 35. As a result, the mesa structure 39, the first distribution Bragg reflector structure 33, and the second distribution Bragg reflector structure 35 constitute a laser cavity.

The first openings 34d to 34g and the second openings 36d to 36g are each defined by a first width L1 (length in the direction of the first axis Ax1) and a second width L2 (length in a direction of the third axis Ax3 intersecting the first axis Ax1). The first width L1 is defined by Bragg conditions. The second width L2 is correlated to local supply of the etching gas. The second width L2 of the first openings 34d to 34g and the second openings 36d to 36g may be changed in order to adjust the local flow of the etching gas, specifically, local supply and local discharge of the etching gas. The mask 31 may have a connecting opening that connects the first openings 34d to 34g (second openings 36d to 36g) to one another so that the local flow of the etching gas is adjusted by changing the width of the connecting opening.

Figure 3B:
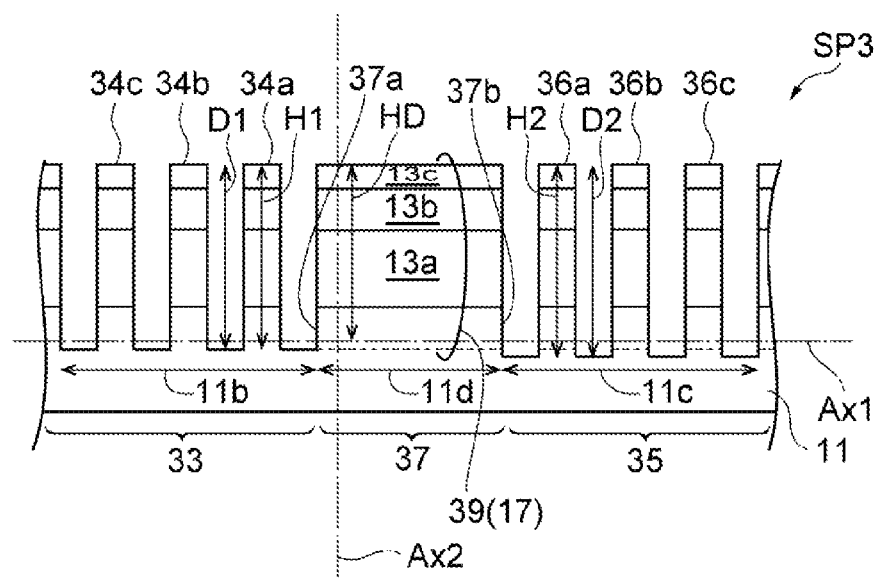

After completion of dry etching ETCH, the mask 31 is removed to obtain a third substrate product SP3, as shown in FIG. 3B. The mask 31 made of SiN is removed by etching using buffered hydrofluoric acid.

According to a method for producing a quantum cascade laser, both the first distribution Bragg reflector structure 33 having a λ/4 period and the second distribution Bragg reflector structure 35 having a 3λ/4 are produced by the process of the dry-etching ETCH. Local etching in the area where the second distribution Bragg reflector structure 35 having a 3λ/4 period is to be formed proceeds faster than local etching in the area where the first distribution Bragg reflector structure 33 having a λ/4 period is to be formed. Thus, the etch depth (D2) of the 3λ/4 period is larger than the etch depth (D1) of the λ/4 period. Because the depth (D2) of the periodic structure is large, the reflectivity of the second distribution Bragg reflector structure 35 is increased. Because the depth (D1) of the periodic structure is small, the reflectivity of the first distribution Bragg reflector structure 33 is decreased. This difference in structure makes it possible to generate a difference in reflectivity between the two distribution Bragg reflector structures from the technical viewpoint different from the difference in optical properties (reflectivity) derived from the structures correlated to the λ/4 period and the 3λ/4 period.

Referring again to FIG. 3B, the substrate 11 includes a first region 11b, a second region 11c, and a third region 11d. The first region 11b, the second region 11c, and the third region 11d are arranged in the direction of the first axis Ax1. The third region 11d of the substrate 11 is disposed between the first region 11b and the second region 11c. The semiconductor waveguide structure 37 is disposed in the third region 11d. The semiconductor waveguide structure 37 includes the mesa structure 39 and the buried region 25. The first distribution Bragg reflector structure 33 is disposed in the first region 11b. The first distribution Bragg reflector structure 33 includes a semiconductor wall 34a disposed closest to the first end facet 37a of the semiconductor waveguide structure 37 to constitute a distribution Bragg reflector structure. The semiconductor wall 34a is placed a first interval DS1 apart from the first end facet 37a of the semiconductor waveguide structure 37. The second distribution Bragg reflector structure 35 is disposed in the second region 11c. The second distribution Bragg reflector structure 35 includes a semiconductor wall 36a disposed closest to the second end facet 37b of the semiconductor waveguide structure 37 to constitute a distribution Bragg reflector structure. The semiconductor wall 36a is placed a second interval DS2 apart from the second end facet 37b of the semiconductor waveguide structure 37. The second interval DS2 is larger than the first interval DS1.

According to the method for producing quantum cascade laser, the semiconductor wall 34a of the first distribution Bragg reflector structure 33 is placed a first interval DS1 apart from the first end facet 37a of the semiconductor waveguide structure 37. The semiconductor wall 36a of the second distribution Bragg reflector structure 35 is placed a second interval DS2 apart from the second end facet 37b of the semiconductor waveguide structure 37. A patterned mask 31 for forming the first interval DS1 and the second interval DS2 that may be formed in the same dry etching step for processing the laser structure 19 is used. The patterns corresponding to the two intervals are different from each other. The mask 31 includes a first mask portion 31a that has a pattern for forming the first distribution Bragg reflector structure 33 and a second mask portion 31b that has a pattern for forming the second distribution Bragg reflector structure 35. The first mask portion 31a has a first opening that defines the first interval DS1 between the semiconductor wall 34a and the first end facet 37a of the semiconductor waveguide structure 37. The second mask portion 31b has a second opening that defines the second interval DS2 between the semiconductor wall 36a and the second end facet 37b of the semiconductor waveguide structure 37. Due to the difference between the width of the first opening and the width of the second opening, the etching rate differs locally between these areas. Specifically, the etch depth formed through a wide opening is larger than the etch depth formed through a narrow opening. Due to this difference, the height H1 of the semiconductor wall 34a is different from the height H2 of the semiconductor wall 36a. The height H2 of the semiconductor wall 36a is larger than the mesa height HD in order to realize a relatively high reflectivity. The height H1 of the semiconductor wall 34a is smaller than the mesa height HD in order to realize a relatively low reflectivity according to the desired reflectivity.

Referring to FIG. 4 in addition to FIG. 3B, the mesa structure 39 extends in a direction of the first axis Ax1. The first semiconductor walls 34a, 34b, and 34c protrude in a direction of a second axis Ax2 that intersects the principal surface 11a of the substrate 11. If needed, the first distribution Bragg reflector structure 33 may include a first side wall 33a that connects a first end of the semiconductor wall 34a of the first semiconductor walls to the semiconductor waveguide structure 37 and a second side wall 33b that connects a second end of the semiconductor wall 34a to the semiconductor waveguide structure 37. The first end and the second end of the semiconductor wall 34a are arranged in a direction of a third axis Ax3 that intersects the first axis Ax1 and the second axis Ax2.

According to this production method, the first ends and the second ends of the first semiconductor walls 34a, 34b, and 34c, for example, the first end and the second end of the semiconductor wall 34a, are respectively connected to the first side wall 33a and the second side wall 33b. During performance of etching through the mask 31, etching gas is supplied from the opening that corresponds to the first interval DS1 between the first end facet 37a of the semiconductor waveguide structure 37 and the semiconductor wall 34a. The area of the opening changes depending on the interval between the first side wall 33a and the second side wall 33b. The first ends of the first semiconductor walls 34a, 34b, and 34c are connected to one another through the first side wall 33a and to the semiconductor waveguide structure 37 through the first side wall 33a. The second ends of the first semiconductor walls 34a, 34b, and 34c are connected to one another through the second side wall 33b and to the semiconductor waveguide structure 37 through the second side wall 33b. During etching by using the mask 31, etching gas is supplied from openings that define adjacent two first semiconductor walls among the first semiconductor walls 34a, 34b, and 34c. The area of the openings is changed depending on whether the first side wall 33a and the second side wall 33b exist. If these side walls exist, the area of the openings is changed depending on the interval between the first side wall 33a and the second side wall 33b.

As with the structure of the first distribution Bragg reflector structure 33, the second distribution Bragg reflector structure 35 may include a third side wall 33c and a fourth side wall 33d. The third side wall 33c connects first ends of the second semiconductor walls 36a, 36b, and 36c, for example, a first end of the semiconductor wall 36a, to the semiconductor waveguide structure 37. The fourth side wall 33d connects the second end of the semiconductor wall 36a to the semiconductor waveguide structure 37. The first end and the second end of the semiconductor wall 36a are arranged in a direction of the third axis Ax3. The local etching rate correlated to the second distribution Bragg reflector structure 35 changes depending on the interval between the third side wall 33c and the fourth side wall 33d.

Figure 5:
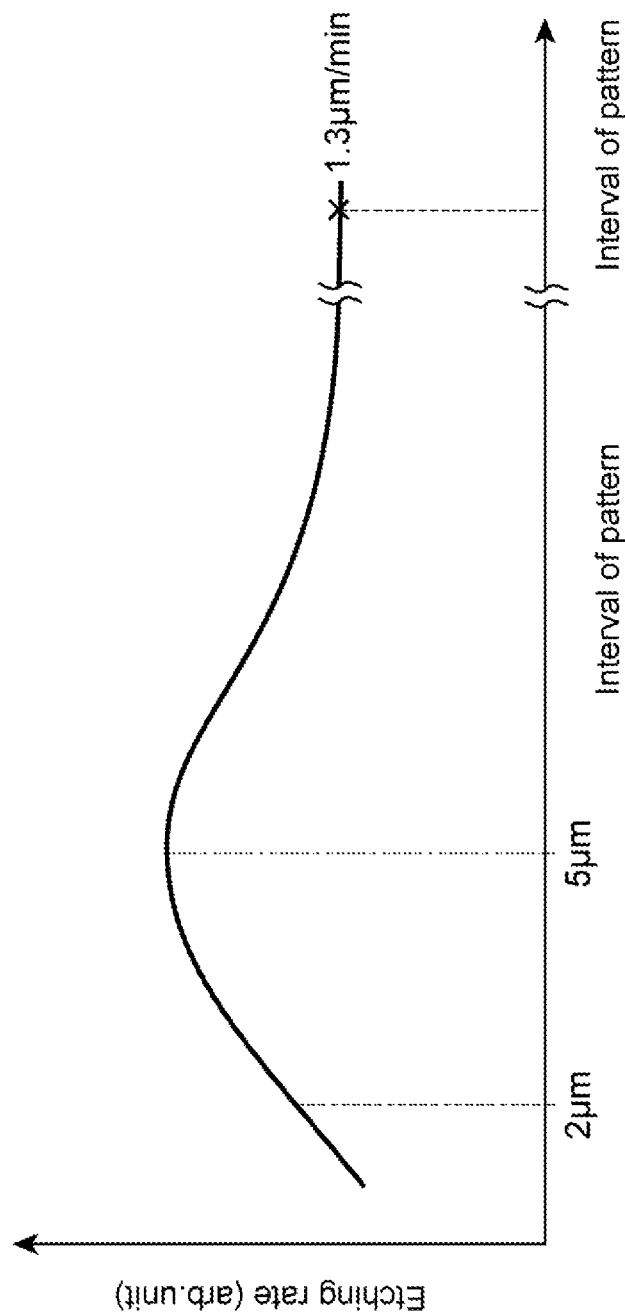
FIG. 5 is a schematic diagram illustrating major steps of the method for producing a quantum cascade laser according to the embodiment.

FIG. 5 is a graph showing the relationship between the pattern interval and the etching rate obtained by experiments. The data illustrated in the graph and other experimental results show that the etching rate in dry etching for forming a distribution Bragg reflector structure changes depending on the opening size that defines the interval between the two semiconductor walls. In this experiment, the etching rate shows a local maximum at an interval of 5 μm. At an interval exceeding 5 μm, the etching area increases. Therefore, the consumption of the etchant increases. As a result, the local etching rate decreases. At an interval smaller than 5 μm, supply of the etchant is short compared to the consumption of the etchant. As a result, the local etching rate decreases.

Representative examples of the data are as follows:
Pattern Interval, Etching Rate
2 μm, 1.6 μm/min
5 μm, 2.5 μm/min
Isolated pattern, 1.3 μm/min This difference in etching rate may be associated with the local etching rate for etching for forming a distribution Bragg reflector structure.

FIGS. 6A and 6B are cross-sectional views of two distribution Bragg reflector structures formed in the same device section. FIG. 6A shows a cross-section of a distribution Bragg reflector structure having a λ/4 period. FIG. 6B shows a cross-section of a distribution Bragg reflector structure having a 3λ/4 period. Due to the difference in refractive index between the semiconductor and air, the interval of the semiconductor walls (width: 500 nm) for the distribution Bragg reflector structure having a λ/4 period is about 2000 nm. The interval of the semiconductor walls (width: 1500 nm) for the distribution Bragg reflector structure having a 3λ/4 period is about 5000 nm. By using the difference in interval, the difference in etching rate occurs effectively during etching for forming a distribution Bragg reflector structure having a λ/4 period and a distribution Bragg reflector structure having a 3λ/4 period. In this etching, these different etching rates are realized locally in the single etching step. Because of the different etching rates, semiconductor walls having a height of 5000 nm are formed near the distribution Bragg reflector structure having a λ/4 period and semiconductor walls having a height of 8000 nm are formed near the distribution Bragg reflector structure having a 3λ/4 period. The distribution Bragg reflector structure having a 3λ/4 and containing a portion deeper than the lower surface of the core layer reflects light propagating in the substrate. In contrast, the distribution Bragg reflector structure having a λ/4 period does not effectively reflect light propagating in the substrate since it does not contain a portion deeper than the lower surface of the core layer, or since the depth of the deeper portion than the lower surface of the core layer is small.

The degree of reflecting light propagating in the substrate (hereinafter referred to as "substrate propagating light") is associated with the reflectivity of the distribution Bragg reflector structures. A larger number of semiconductor walls contributes to increasing reflectivity in a distribution Bragg reflector structure separate from the reflection of the substrate propagating light. Moreover, the difference in the height of semiconductor walls between the two distribution Bragg reflector structures generates a difference in reflecting the substrate propagating light separately from the reflective properties attributable to the periods of the distribution Bragg reflector structures. From this viewpoint, when a semiconductor wall of a distribution Bragg reflector structure is divided into a semiconductor wall upper portion positioned above the core layer and a semiconductor wall lower portion positioned below the core layer, the length of the semiconductor wall lower portion is different between the semiconductor walls of the two distribution Bragg reflector structures. According to this production method, a distribution Bragg reflector structure having a 3λ/4 and a distribution Bragg reflector structure having a λ/4 period that constitute a laser cavity in a single device section are fabricated as a structure that is useful for creating the difference in length of the semiconductor wall lower portion in a depth direction (a direction of the second axis Ax2). The quantum cascade laser includes a cavity in which the length of the semiconductor wall lower portion in a distribution Bragg reflector structure having a 3λ/4 period and the length of the semiconductor wall lower portion in a distribution Bragg reflector structure having a λ/4 period are different from each other. According to this structure, the difference in capacity to reflect the substrate propagating light creates the difference in reflectivity between the two distribution Bragg reflector structures separately from the reflectivity of the distribution Bragg reflector structure derived from the period.

Figure 7A:
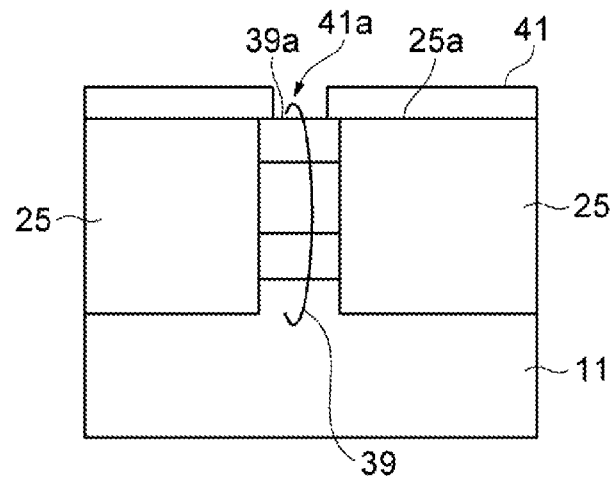
FIG. 7A to 7C are schematic diagrams of major steps of the method for producing a quantum cascade laser according to the embodiment.
Figure 7B:
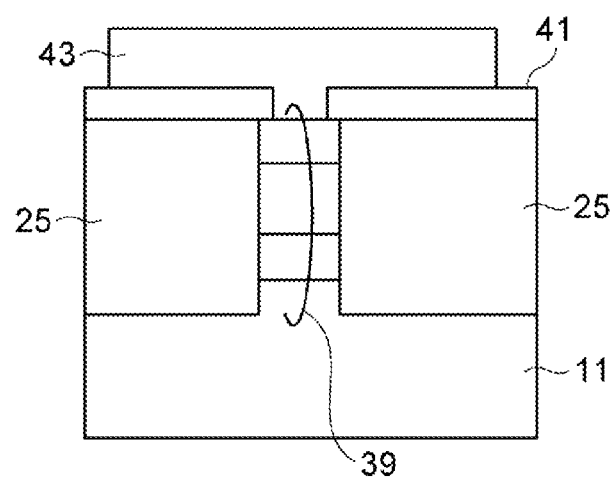
Figure 7C:
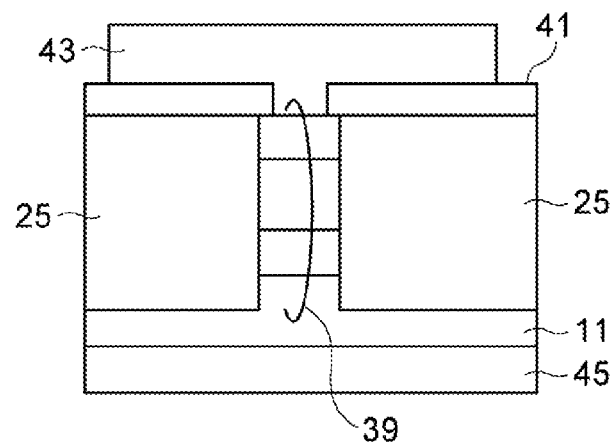

Back to describing the production method, after the distribution Bragg reflector structures (33 and 35) are formed, a protective film 41 (for example, a SiON film) is formed on an upper surface 39a of the mesa structure 39 and an upper surface 25a of the buried region 25, as illustrated in FIG. 7A. The protective film 41 has an opening 41a positioned on the upper surface 39a of the mesa structure 39 so as to allow an electrode to contact a surface of the top semiconductor layer of the mesa structure. After the protective film 41 is formed, as shown in FIG. 7B, a first electrode 43 is formed on the surface of the top semiconductor layer of the mesa structure through the opening 41a of the protective film 41. The first electrode 43 has, for example, a Ti/Pt/Au structure. If needed, the back surface of the substrate 11 is polished, and, as illustrated in FIG. 7C, a second electrode 45 is formed on the back surface of the substrate 11. The second electrode 45 has, for example, a Ti/Pt/Au structure. Through these steps, a quantum cascade laser is produced. According to this embodiment, a quantum cascade laser having a cavity length of 0.5 mm or less at minimum is produced.

An example of a quantum cascade laser having a reflector formed by this method is as follows:

The quantum cascade laser has a buried heterostructure. The reflector has a structure in which semiconductor walls and air gaps are alternately arranged.

Height of semiconductor wall of high-reflection end facet: 8 μm

Height of semiconductor wall of light-emitting end facet: 5 μm

Figure 8:
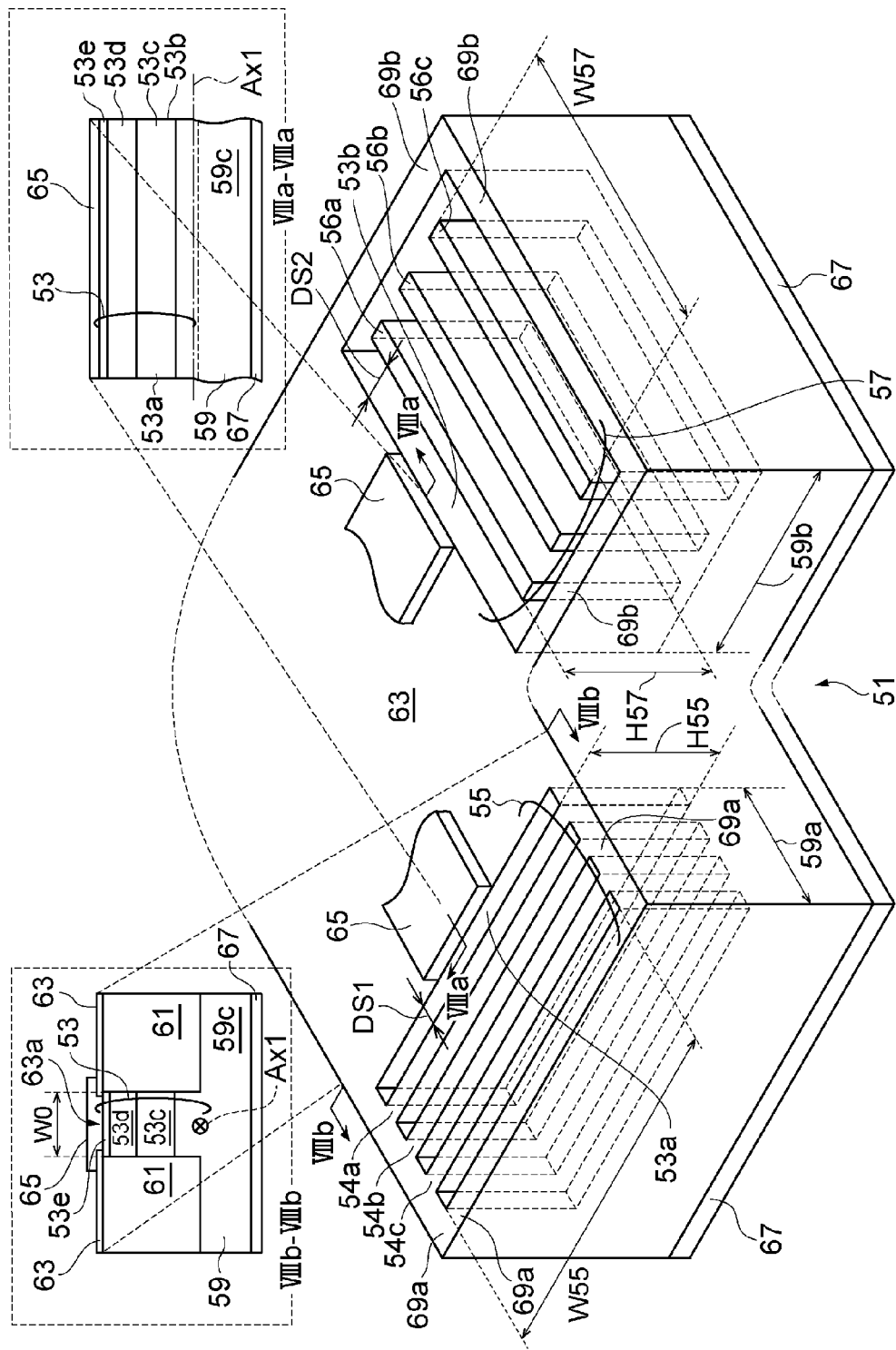
FIG. 8 is a schematic diagram of a quantum cascade laser according to an embodiment.

Number of semiconductor walls: 2 pairs
Cavity length: 1.5 mm
Mesa width: 10 μm
Oscillation wavelength: 7 μm
Power consumption: 1 W
Optical output: 2 mW FIG. 8 is a schematic diagram of a quantum cascade laser according to an embodiment. A quantum cascade laser 51 includes a mesa structure 53, a first distribution Bragg reflector structure 55, and a second distribution Bragg reflector structure 57.

The mesa structure 53 extends in a direction of the first axis Ax1 and has a first end facet 53a and a second end facet 53b. The mesa structure 53 includes a quantum cascade core layer 53c, a cladding layer 53d, and a contact layer 53e. The first distribution Bragg reflector structure 55 is optically coupled to the first end facet 53a of the mesa structure 53 and includes one of a λ/4 periodic structure and a 3λ/4 periodic structure. The second distribution Bragg reflector structure 57 is optically coupled to the second end facet 53b of the mesa structure 53 and has the other one of the λ/4 periodic structure and the 3λ/4 periodic structure. Here, λ denotes the oscillation wavelength of the quantum cascade laser 51 in vacuum. The first distribution Bragg reflector structure 55 includes a semiconductor wall 54a placed a first interval DS1 apart from the first end facet 53a of the mesa structure 53. The second distribution Bragg reflector structure 57 includes a semiconductor wall 56a placed a second interval DS2 apart from the second end facet 53b of the mesa structure 53. The height of the semiconductor wall 56a is different from the height of the semiconductor wall 54a. The width of the semiconductor wall 54a and the width of the semiconductor wall 56a are both larger than the mesa width W0 of the mesa structure 53.

According to the quantum cascade laser 51, the first interval DS1 between one side surface of the semiconductor wall 54a in the first distribution Bragg reflector structure 55 and the first end facet 53a of the mesa structure 53 is correlated to one of the λ/4 periodic structure and the 3λ/4 periodic structure (for example, the λ/4 periodic structure). The second interval DS2 between one side surface of the semiconductor wall 56a in the second distribution Bragg reflector structure 57 and the second end facet 53b of the mesa structure 53 is correlated to the other one of the λ/4 periodic structure and the 3λ/4 periodic structure (for example, the 3λ/4 periodic structure). The first distribution Bragg reflector structure 55 includes a semiconductor wall 54a having a width W55 larger than the mesa width W0 of the mesa structure 53. The second distribution Bragg reflector structure 57 includes a semiconductor wall 56a having a width W57 larger than the mesa width W0 of the mesa structure 53. This structure is suitable for reflecting light in the infrared wavelength region. The height H55 of the semiconductor wall 54a is different from the height H57 of the semiconductor wall 56a. The reflectivity of these distribution Bragg reflector structures may be changed by changing the height of each semiconductor wall. Specifically, the distance between the lower surface of the quantum cascade core layer 53c and the lower end of the semiconductor wall 54a is different from the distance between the lower surface of the quantum cascade core layer 53c and the lower end of the semiconductor wall 56a. The difference in interval generates a difference in reflecting the substrate propagating light that propagates in the semiconductor wall lower portion below the lower surface of the quantum cascade core layer 53c.

The quantum cascade laser 51 further includes a substrate 59. The substrate 59 includes a first region 59a, a second region 59b, and a third region 59c. The third region 59c of the substrate 59 is disposed between the first region 59a and the second region 59b. The first distribution Bragg reflector structure 55 is disposed on the first region 59a and the second distribution Bragg reflector structure 57 is disposed on the second region 59b. The mesa structure 53 is disposed on the third region 59c.

The quantum cascade laser 51 includes a buried region 61 that embeds the side surface of the mesa structure 53. The upper surfaces of the mesa structure 53 and the buried region 61 are covered with an insulating protective film 63. If needed, the insulating protective film 63 covers the surfaces of the first distribution Bragg reflector structure 55 and the second distribution Bragg reflector structure 57. The insulating protective film 63 has a contact opening 63a. A first electrode 65 makes contact with the upper surface of the mesa structure 53 through the contact opening 63a. A second electrode 67 makes contact with the back surface of the substrate 59.

Each of the first distribution Bragg reflector structure 55 and the second distribution Bragg reflector structure 57 preferably includes three or more semiconductor walls. If needed, the quantum cascade laser 51 may include a first outer wall 69a that surrounds the first distribution Bragg reflector structure 55. In addition, an end of the first semiconductor wall (54a, 54b, 54c) of the first distribution Bragg reflector structure 55 may be connected to the first outer wall 69a (this is referred to as a "connected structure"). The quantum cascade laser 51 may include a second outer wall 69b that surrounds the second distribution Bragg reflector structure 57. An end of the second semiconductor wall (56a, 56b, 56c) of the second distribution Bragg reflector structure 57 may be distant from the second outer wall 69b (this is referred to as an "independent structure"). As mentioned above, the first distribution Bragg reflector structure 55 is one of the $\lambda/4$ periodic structure and the $3\lambda/4$ periodic structure and the second distribution Bragg reflector structure 57 is the other one of the $\lambda/4$ periodic structure and the $3\lambda/4$ periodic structure. The grating period of the first distribution Bragg reflector structure 55 is different from the grating period of the second distribution Bragg reflector structure 57. The difference between the height H55 of the first semiconductor wall (54a, 54b, 54c) and the height H57 of the second semiconductor wall (56a, 56b, 56c) is, for example, 3 µm or more. The difference between the length of the semiconductor wall lower portion of the first semiconductor wall (54a, 54b, 54c) and the length of the semiconductor wall lower portion of the second semiconductor wall (56a, 56b, 56c) is, for example, 3 µm or more. These differences contribute to forming a significant difference in reflectivity for the substrate propagating light between the first distribution Bragg reflector structure 55 and the second distribution Bragg reflector structure 57.

FIGS. 9 to 14 show several structures of the reflectors. The combination of the connecting structure and the independent structure and the $\lambda/4$ periodic structure and the $3\lambda/4$ periodic structure is as follows. The outer wall is related to the amount of etchant locally supplied in forming the distribution Bragg reflector structures by etching. The connecting structure and the independent structure are both related to supply of the etchant during formation of the distribution Bragg reflector structures by etching.

Figure 9:
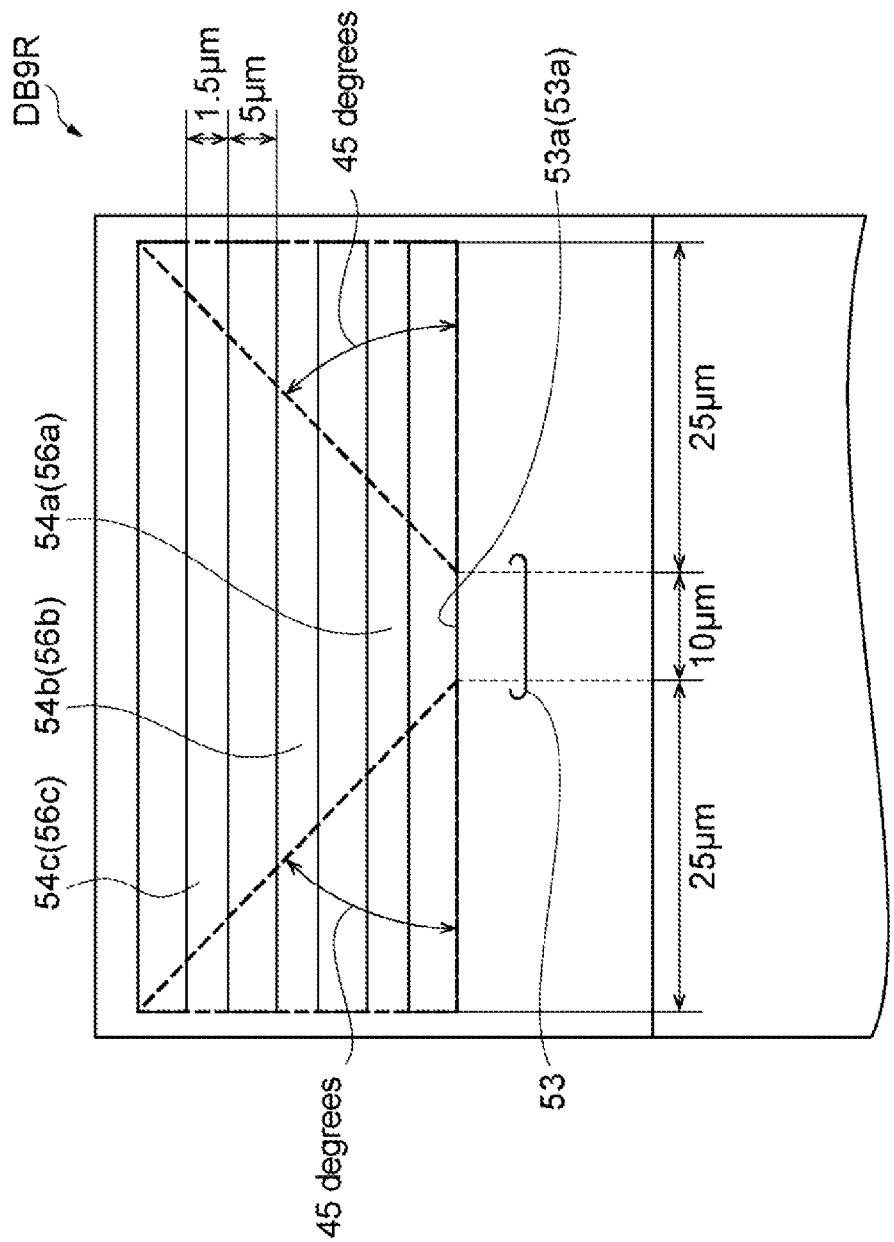
FIG. 9 is a plan view of a distribution Bragg reflector structure DB9R having a $3\lambda/4$ period.

A combination of a $\lambda/4$ periodic structure with a connecting structure and a $3\lambda/4$ periodic structure with a connecting structure A combination of a $\lambda/4$ periodic structure with a connecting structure and a $3\lambda/4$ periodic structure having an independent structure A combination of a $\lambda/4$ periodic structure having an independent structure and a $3\lambda/4$ periodic structure with a connecting structure A combination of a $\lambda/4$ periodic structure having an independent structure and a $3\lambda/4$ periodic structure having an independent structure FIG. 9 is a plan view of a distribution Bragg reflector structure DB9R having a $3\lambda/4$ period. The distribution Bragg reflector structure DB9R includes multiple semiconductor walls, for example, three semiconductor walls. The thickness of each semiconductor wall is, for example, 1.5 µm. The interval between the emitting end facet (53a, 53b) and the semiconductor wall and the interval between the semiconductor walls are, for example, 5 µm to define the air gap. Light emitted from the emission end facet (53a, 53b) spreads at an angle of about 45 degrees, for example. Each of the semiconductor walls have first and second extended portions respectively on the left and right sides of the edges of the mesa structure 53 so that the semiconductor walls may receive and reflect the emitted light from the emission end facet (53a, 53b). The first and second extended portions each have a predetermined length (for example, 25 µm or more). The outer wall of the distribution Bragg reflector structure DB9R connects ends of the semiconductor walls.

Figure 10:
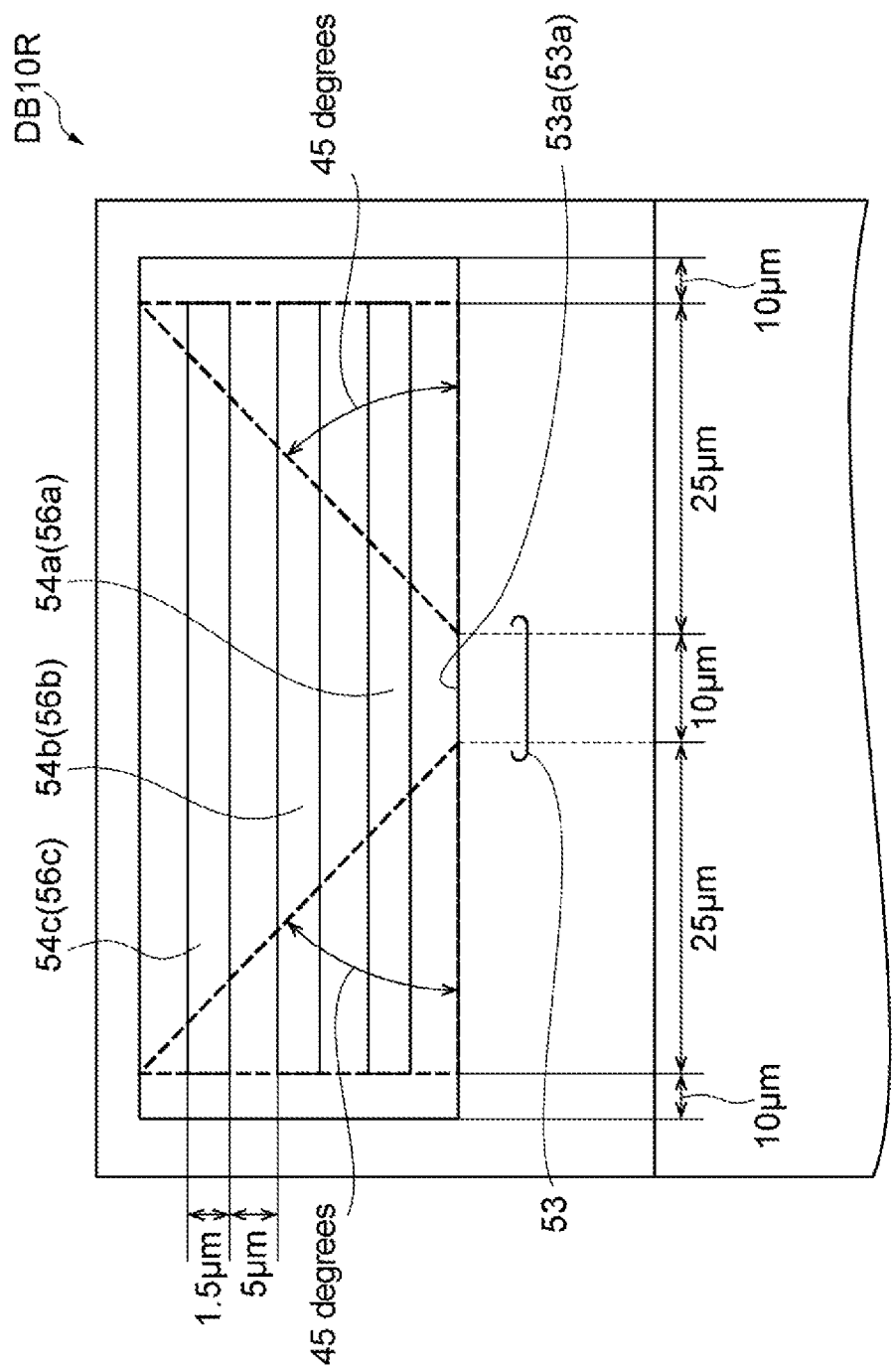
FIG. 10 is a plan view of a distribution Bragg reflector structure DB10R having a $3\lambda/4$ period.

FIG. 10 is a plan view of a distribution Bragg reflector structure DB10R having a $3\lambda/4$ period. The distribution Bragg reflector structure DB10R includes multiple semiconductor walls, for example, three semiconductor walls. The thickness of each semiconductor wall is, for example, 1.5 µm. The interval between the emitting end facet (53a, 53b) and the semiconductor wall and the interval between the semiconductor walls are, for example, 5 µm to define the air gap. Light emitted from the emission end facet (53a, 53b) spreads at an angle of about 45 degrees. Each of the semiconductor walls have first and second extended portions respectively on the left and right sides of the edges of the mesa structure 53 so that the semiconductor walls may receive and reflect the emitted light from the emission end facet (53a, 53b). The first and second extended portions each have a predetermined length (for example, 25 µm or more). The ends of the semiconductor walls are distant from the outer wall of the distribution Bragg reflector structure DB10R.

Figure 11:
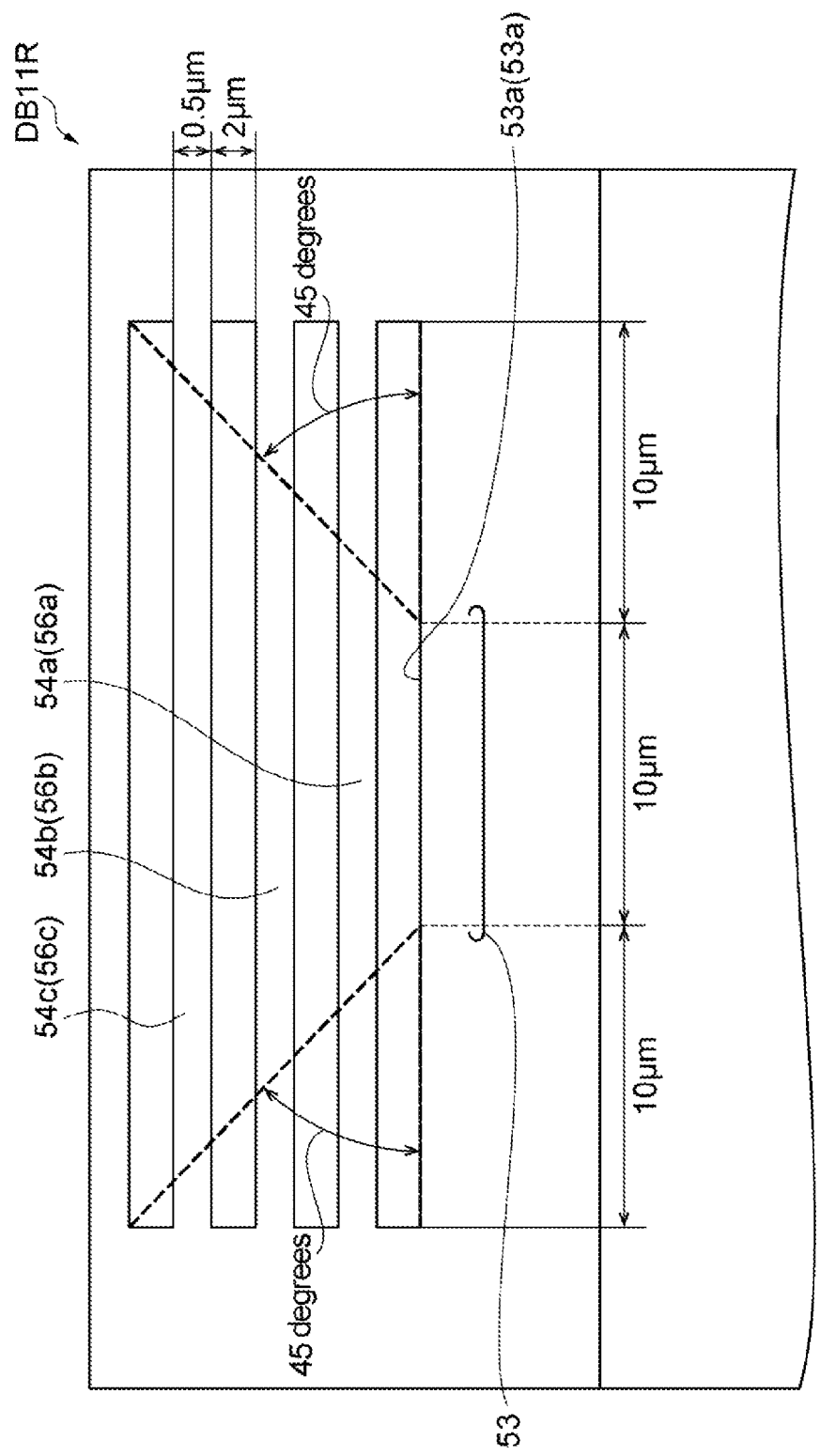
FIG. 11 is a plan view of a distribution Bragg reflector structure DB11R having a $\lambda/4$ period.

FIG. 11 is a plan view of a distribution Bragg reflector structure DB11R having a $\lambda/4$ period. The distribution Bragg reflector structure DB11R includes multiple semiconductor walls, for example, three semiconductor walls. The thickness of each semiconductor wall is 0.5 µm. The interval between the emitting end facet (53a, 53b) and the semiconductor wall and the interval between the semiconductor walls are, for example, 2 µm to define the air gap. Light emitted from the emission end facet (53a, 53b) spreads at an angle of about 45 degrees, for example. Each of the semiconductor walls have first and second extended portions respectively on the left and right sides of the edges of the mesa structure 53 so that the semiconductor wall may receive and reflect the emitted light from the emission end facet (53a, 53b). The first and second extended portions each have a length of 10 µm. The outer wall of the distribution Bragg reflector structure DB11R supports the ends of the mesa structure 53.

Figure 12:
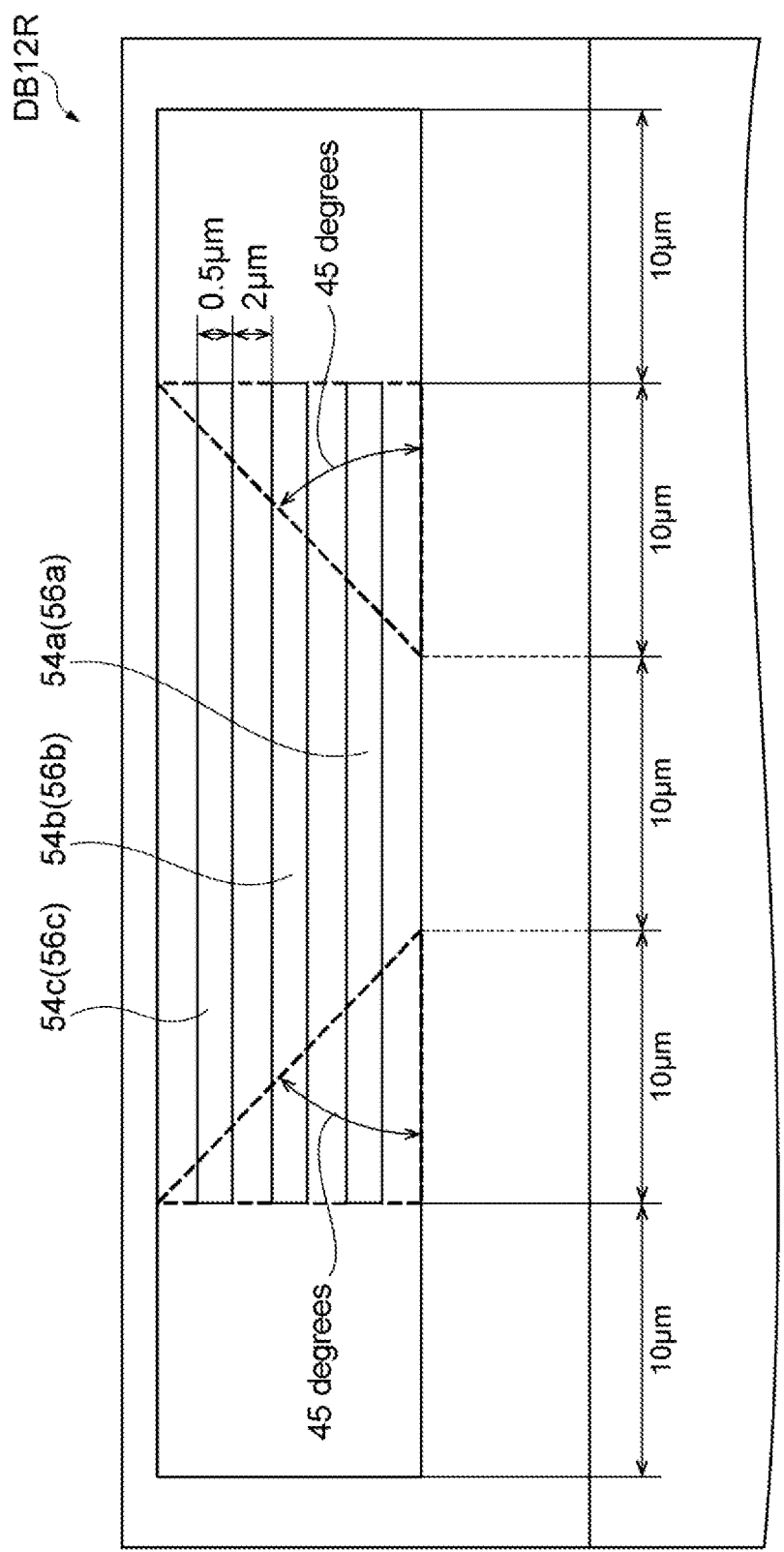
FIG. 12 is a plan view of a distribution Bragg reflector structure DB12R having a $\lambda/4$ period.

FIG. 12 is a plan view of a distribution Bragg reflector structure DB12R having a λ/4 period. The distribution Bragg reflector structure DB12R includes three semiconductor walls. The thickness of each semiconductor wall is 0.5 µm. The interval between the semiconductor walls and the interval between the emitting end facet (53a, 53b) and the semiconductor wall are, for example, 2 µm to define the air gap. Light emitted from the emission end facet (53a, 53b) spreads at an angle of about 45 degrees, for example. Each of the semiconductor walls have first and second extended portions respectively on the left and right sides of the edges of the mesa structure 53 so that the semiconductor wall may receive and reflect the spreading light. The first and second extended portions each have a particular length (for example, 10 µm or more). The ends of the mesa structure 53 are distant from the outer wall of the distribution Bragg reflector structure DB12R.

Figure 13:
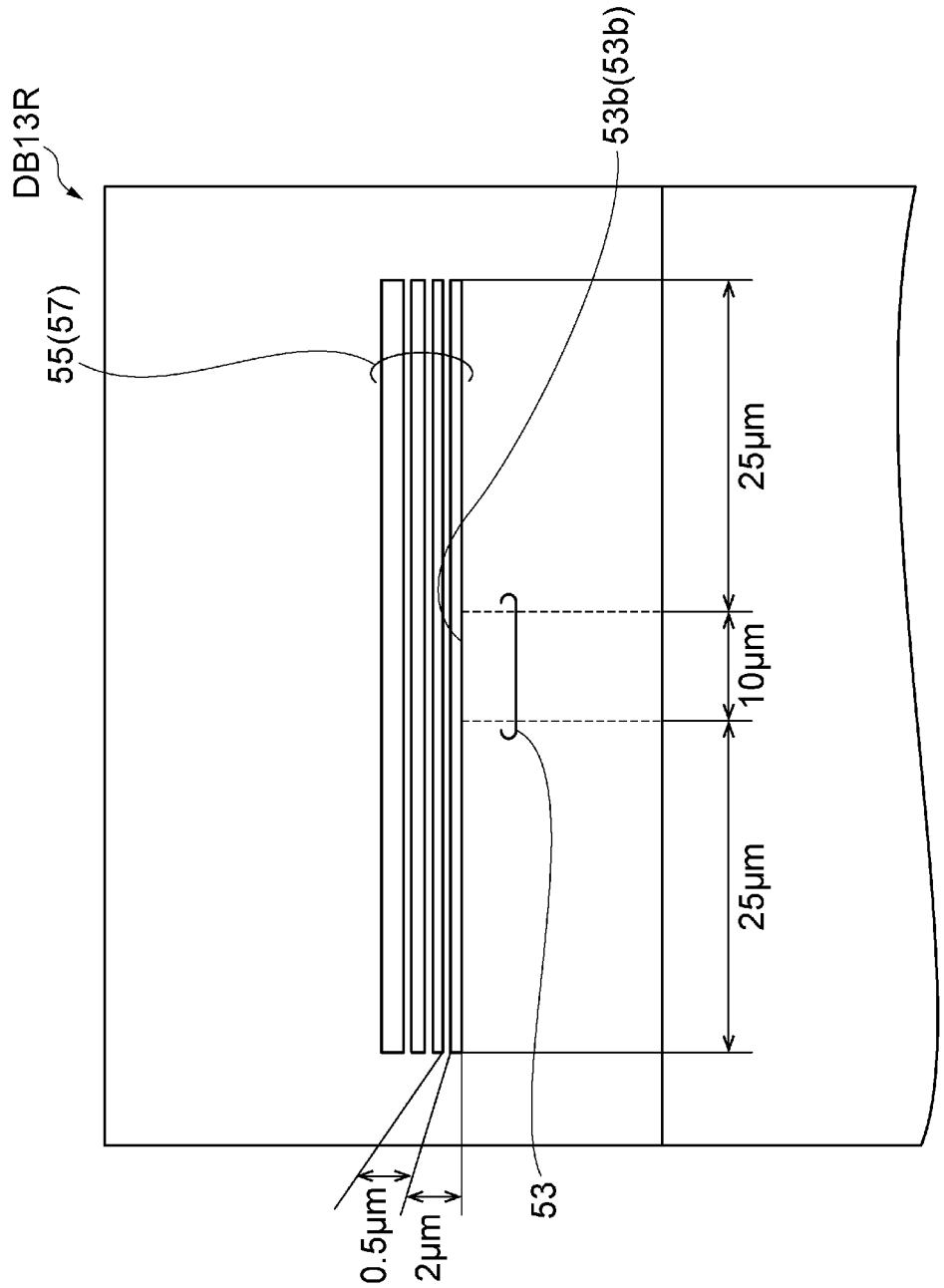
FIG. 13 is a plan view of a distribution Bragg reflector structure DB13R having a λ/4 period.

FIG. 13 is a plan view of a distribution Bragg reflector structure DB13R having a λ/4 period. The distribution Bragg reflector structure DB13R includes three semiconductor walls. The thickness of each semiconductor wall is 0.5 µm. The interval between the semiconductor walls and the interval between the semiconductor wall and the emission end facet (53a, 53b) are, for example, 2 µm to define the air gap. Light emitted from the emission end facet (53a, 53b) spreads at an angle of about 45 degrees. In order for the semiconductor walls to receive and reflect the spreading light, each of the semiconductor walls has 10-µm long extended portions respectively on the left and right sides of the edges of the mesa structure 53. The outer wall of the distribution Bragg reflector structure DB13R supports the ends of the mesa structure 53.

Figure 14:
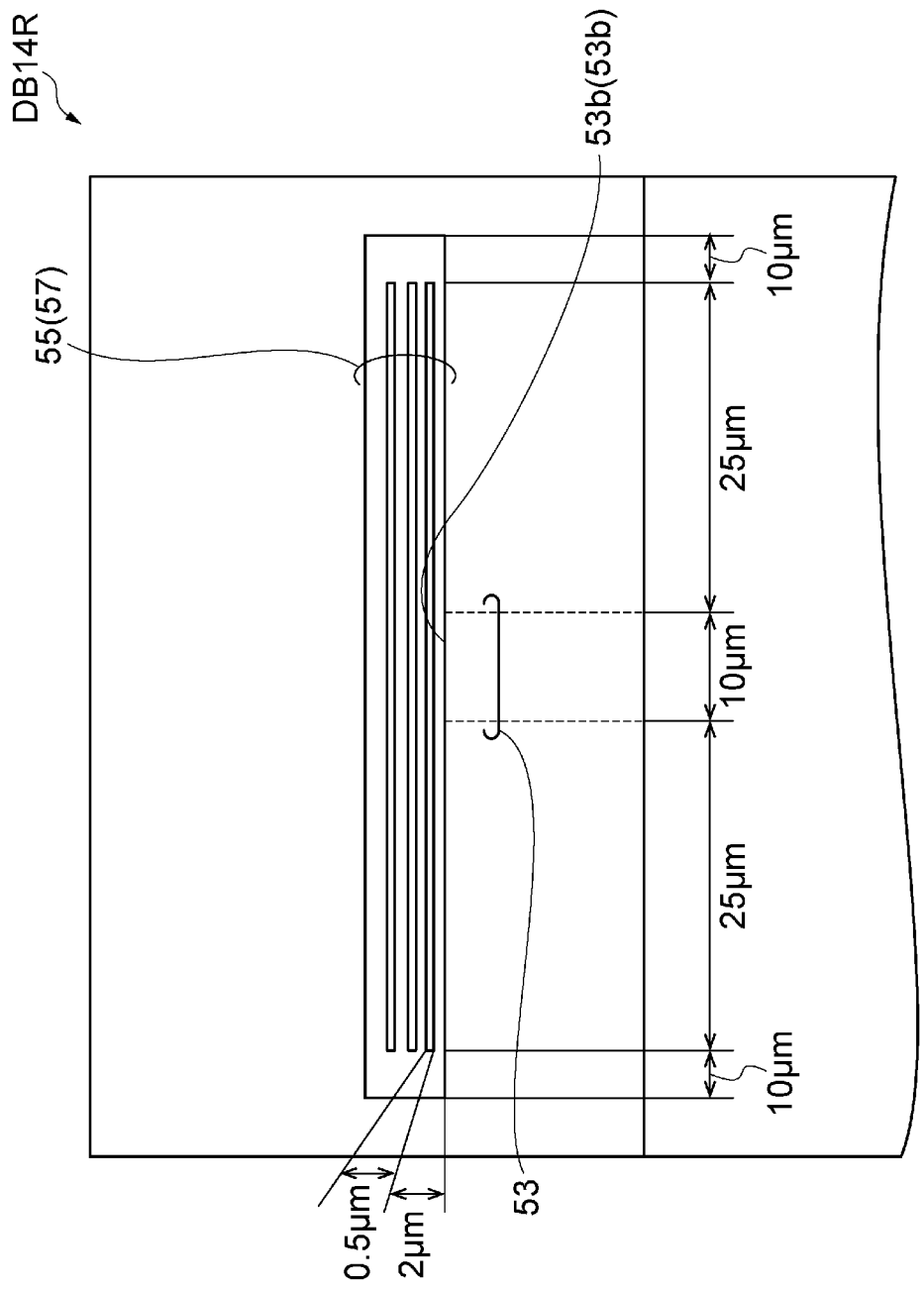
FIG. 14 is a plan view of a distribution Bragg reflector structure DB14R having a λ/4 period.

FIG. 14 is a plan view of a distribution Bragg reflector structure DB14R having a λ/4 period. The distribution Bragg reflector structure DB14R includes three semiconductor walls. The thickness of each semiconductor wall is, for example, 0.5 µm. The interval between the semiconductor walls and the interval between the emitting end facet (53a, 53b) and the semiconductor wall are, for example, 2 µm to define the air gap. Light emitted from the emission end facet (53a, 53b) spreads at an angle of about 45 degrees. In order for the semiconductor walls to receive and reflect the spreading light, each of the semiconductor walls has extended portions respectively on the left and right sides of the edges of the mesa structure 53. The extended portions each have a particular length (for example, 10 µm or more). The ends of the mesa structure 53 are distant from the outer wall of the distribution Bragg reflector structure DB14R.

While the principle of the present invention has been described above through preferable embodiments with reference to the drawings, a person skilled in the art would naturally recognize that various modifications and alterations of arrangement and details are possible without stepping out of the scope of the principle. The present invention is not limited to specific structures disclosed in the embodiments. All modifications and alterations within the scope and spirit of the claims are entitled to protection.

What is claimed is:

1. A method for producing a quantum cascade laser, comprising the steps of:

forming a laser structure on a principal surface of a substrate, the laser structure including a mesa structure and a buried region embedding, the mesa structure, the mesa structure including a quantum cascade core layer;

forming a mask on the laser structure, the mask including a first pattern that defines a λ/4 period distribution Bragg reflector structure and a second pattern that defines a 3λ/4 period distribution Bragg reflector structure; and forming a first distribution Bragg reflector structure having a λ/4 periodic structure, a second distribution Bragg reflector structure having a 3λ/4 periodic structure, and a semiconductor waveguide structure by dry-etching the laser structure through the mask, the semiconductor waveguide structure including the mesa structure and including a first end facet and a second end facet, wherein the first distribution Bragg reflector structure is optically coupled to the first end facet of the semiconductor waveguide structure, the second distribution Bragg reflector structure is optically coupled to the second end facet of the semiconductor waveguide structure, and λ denotes a value of an oscillation wavelength of the quantum cascade laser in vacuum.

2. The method for producing a quantum cascade laser according to claim 1, wherein the substrate includes a first region, a second region, and a third region disposed between the first region and the second region, the first distribution Bragg reflector structure includes a first semiconductor wall disposed in the first region, the first semiconductor wall being placed apart from the first end facet of the semiconductor waveguide structure by a first interval, the second distribution Bragg reflector structure includes a second semiconductor wall disposed in the second region, the second semiconductor wall being placed apart from the second end facet of the semiconductor waveguide structure by a second interval, and the semiconductor waveguide structure is disposed in the third region.

3. The method for producing a quantum cascade laser according to claim 2, wherein the mesa structure extends in a direction of a first axis, the first semiconductor wall protrudes in a direction of a second axis that intersects the principal surface of the substrate, the first distribution Bragg reflector structure includes a first side wall that connects a first end of the first semiconductor wall to the semiconductor waveguide structure and a second side wall that connects a second end of the first semiconductor wall to the semiconductor waveguide structure, and the first end and the second end of the first semiconductor wall are arranged in a direction of a third axis that intersects the first axis and the second axis.

4. The method for producing a quantum cascade laser according to claim 1, wherein the step of dry-etching the laser structure is performed by using an etchant containing halogen-based gas.

* * * * *